United States Patent
Megens et al.

(10) Patent No.: US 8,982,328 B2
(45) Date of Patent: Mar. 17, 2015

(54) METHOD AND APPARATUS FOR OVERLAY MEASUREMENT

(75) Inventors: Henricus Johannes Lambertus Megens, Waalre (NL); Johannes Anna Quaedackers, Veldhoven (NL); Christian Marinus Leewis, Maastricht (NL); Peter Clement Paul Vanoppen, Hechtel-Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 1186 days.

(21) Appl. No.: 12/906,960

(22) Filed: Oct. 18, 2010

(65) Prior Publication Data

US 2011/0141450 A1 Jun. 16, 2011

Related U.S. Application Data

(60) Provisional application No. 61/286,541, filed on Dec. 15, 2009.

(51) Int. Cl.
 *G03F 7/20* (2006.01)

(52) U.S. Cl.
 CPC ........ *G03F 7/70466* (2013.01); *G03F 7/70625* (2013.01); *G03F 7/705* (2013.01); *G03F 7/70633* (2013.01)
 USPC ............................... 355/77; 355/68; 356/399

(58) Field of Classification Search
 CPC ............ G03F 7/70466; G03F 7/70616; G03F 7/70625; G03F 7/70633; G03F 9/70; G03F 2009/005
 USPC .......................... 355/67, 68, 77; 356/399–401
 See application file for complete search history.

(56) References Cited

U.S. PATENT DOCUMENTS

2010/0017005 A1* 1/2010 Adel et al. ..................... 700/97

* cited by examiner

*Primary Examiner* — Colin Kreutzer
(74) *Attorney, Agent, or Firm* — Sterne, Kessler, Goldstein & Fox P.L.L.C.

(57) ABSTRACT

A method of measurement of at-resolution overlay offset may be implemented in a scatterometer. At least three targets are provided on a wafer, each target comprising a first marker grating and a second interleaved marker grating and each target having a different overlay bias between its first and second marker. The first and second markers are provided by subsequent lithography steps in a double patterning lithographic process. The targets are measured with a scatterometer and for each target a measured CD of at least one of the markers is determined using reconstruction. The CD of the first marker may be fixed in the reconstruction. The measured CDs and at least one of the overlay biases is used to determine an overlay result corresponding to a minimum measured CD. The overlay result may be determined by fitting a function such as a parabola to the measured CDs and the overlay biases and determining the overlay at the minimum of the fitted function.

18 Claims, 8 Drawing Sheets

PRIOR ART

US 8,982,328 B2

METHOD AND APPARATUS FOR OVERLAY MEASUREMENT

CROSS REFERENCE TO RELATED APPLICATIONS

This application claim benefit under 35 U.S.C. §119(e) to U.S. Provisional Patent Application No. 61/286,541, filed Dec. 15, 2009, which is incorporated by reference herein in its entirety.

BACKGROUND

1. Field of the Invention

The present invention relates to measurement of overlay usable, for example, in the manufacture of devices by lithographic techniques. Specifically, the present invention relates to measuring targets comprising a first marker and a second marker and each target having a different overlay bias between its first and second marker and using the measurements to determine an overlay result.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The 32nm half pitch (HP) node and beyond will require double patterning immersion lithography (while Extreme Ultra Violet lithography is not ready for mass production). Various known process schemes exist for achieving 32nm HP, amongst them are Litho Freeze Litho Etch (LFLE) and Litho Etch Litho Etch (LELE).

In order to establish acceptable overlay control for control between the two layers, overlay can be measured in various ways. However, overlay is typically not measured at the printed resolution because its measurement is not straightforward. Usually overlay is measured on specifically designed macro-pitch targets and measured using image based or scatterometry based methods. These special features usually do not resemble the product or product pitch. Therefore the link with the real at-resolution overlay is lost. Furthermore, scatterometry methods cannot reconstruct the dual line pattern of double patterning structures at resolution due to loss of sensitivity near the symmetry point.

Overlay at-resolution is sometimes measured on resolution targets using a CD (Critical Dimensions) SEM (Scanning Electron Microscope). That method is expensive, takes time and is not accurate enough (estimated at ~1-2 nm).

SUMMARY

It is desirable to provide a system that accurately measures at-resolution overlay.

According to a first aspect of the present invention, there is provided a method of measurement of overlay offset on a substrate comprising at least three targets. Each target comprises first and second markers. Each target has a different respective predetermined overlay bias between its first and second markers. The method comprises the following steps, no necessarily in order. Measuring the targets. Determining for each target a measured dimension. Using the measured dimensions and at least one of the predetermined overlay biases to determine an overlay offset result corresponding to a minimum dimension.

According to a second aspect of the present invention, there is provided an inspection apparatus for measuring an overlay offset on a substrate comprising at least three targets. Each target comprises first and second markers. Each target has a different respective predetermined overlay bias between its first and second markers. The inspection apparatus comprises a projection system configured to project a radiation beam onto each of the targets, a detector configured to detect radiation having interacted with each of the targets, and a processor configured to determine for each target a measured dimension using the detected radiation and to use the measured dimensions and at least one of the predetermined overlay biases to determine an overlay offset result corresponding to a minimum dimension.

According to a third aspect of the present invention, there is provided a lithographic apparatus comprising an inspection apparatus according to the second aspect.

According to a fourth aspect of the present invention, there is provided a computer program comprising one or more sequences of machine-readable instructions allowing an apparatus to perform a method according to the first aspect.

According to a fifth aspect of the present invention, there is provided a data storage medium having a computer program comprising one or more sequences of machine-readable instructions enabling an apparatus to perform a method according to the first aspect stored therein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention FIG. 1 depicts a lithographic apparatus.

Figure 1:
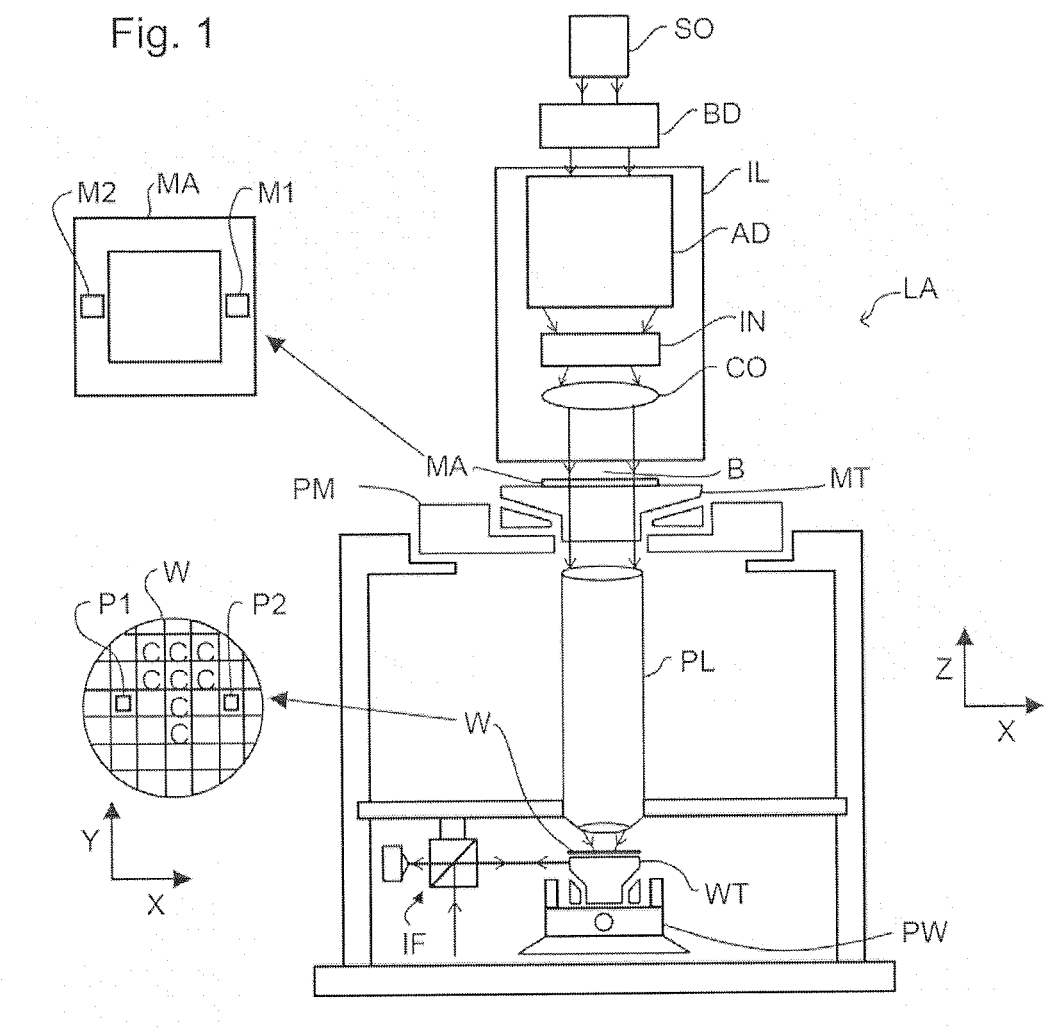

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
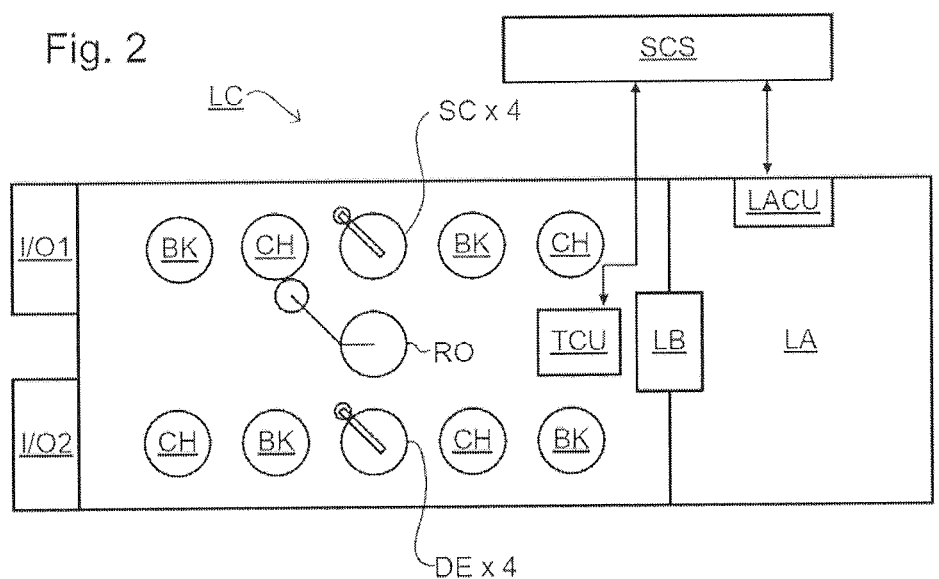
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
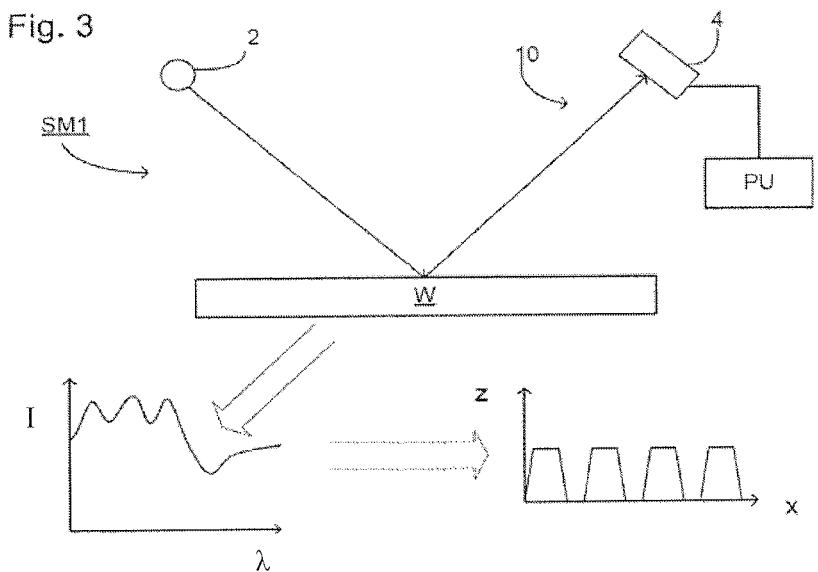
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
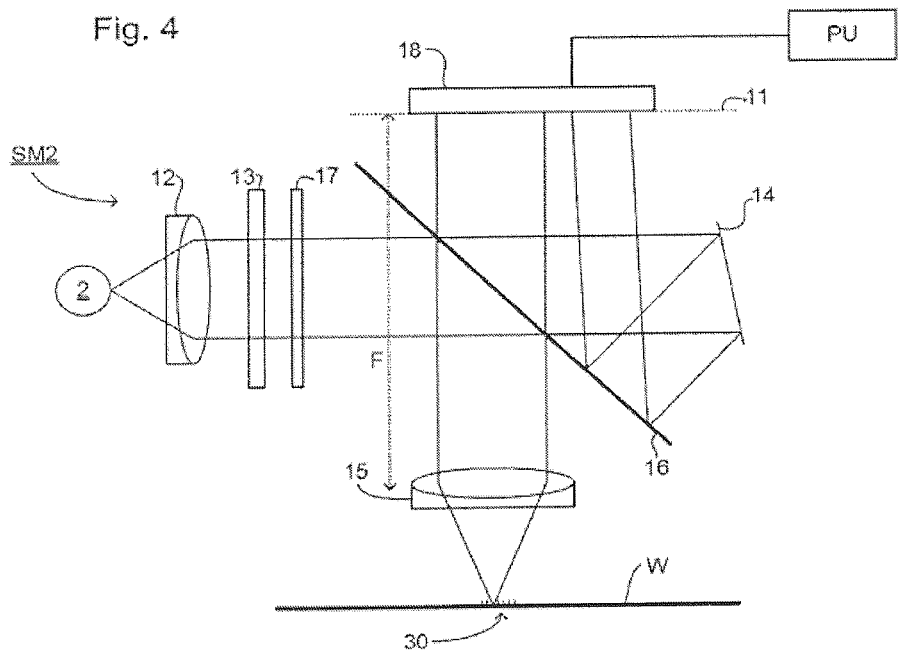
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference minor 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least $2\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP Application No. 1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

Figure 5:
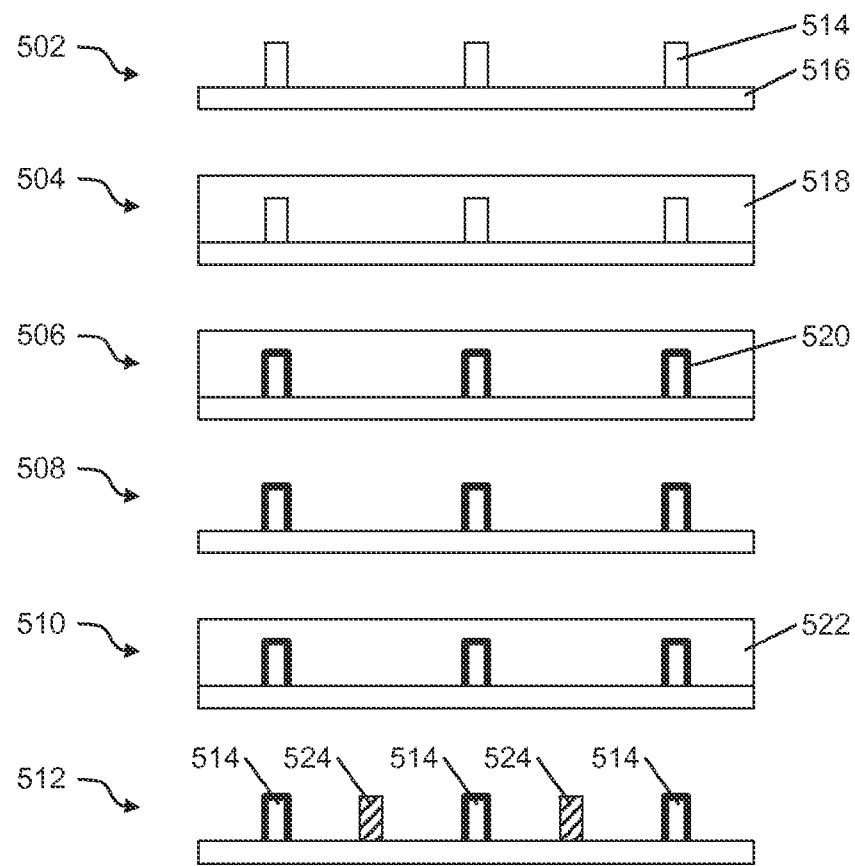
FIG. 5 illustrates a prior art Litho Freeze Litho Etch (LFLE) process for double patterning lithography of a grating structure.

FIG. 5 illustrates the prior art Litho Freeze Litho Etch (LFLE) process for double patterning lithography of a grating structure.

Step 502 is the first exposure and development step that results in a grating pattern with first resist bars 514 shown in cross section on the substrate 516. The next step 504 is coating the substrate with a cross-linking material 518. A mixing bake 506 is performed that results in a cross-linked layer 520 at the interface of the resist bars with the cross-linking material. A development step 508 removes the non-cross-linked residues. A resist coating step 510 results in a second layer of resist 522. The second layer of resist 522 is patterned in a second exposure and development step 512 that results in an interleaved grating structure with second resist bars 524 in between the resist bars 514 formed in the first exposure and development step 502.

In double patterning lithography it is desirable to obtain accurate overlay of the exposure steps 502 and 512 so that there is uniform spacing between the respective pattern features, in this simple case of a grating that is the resist bars 514 and 524.

Figure 6:
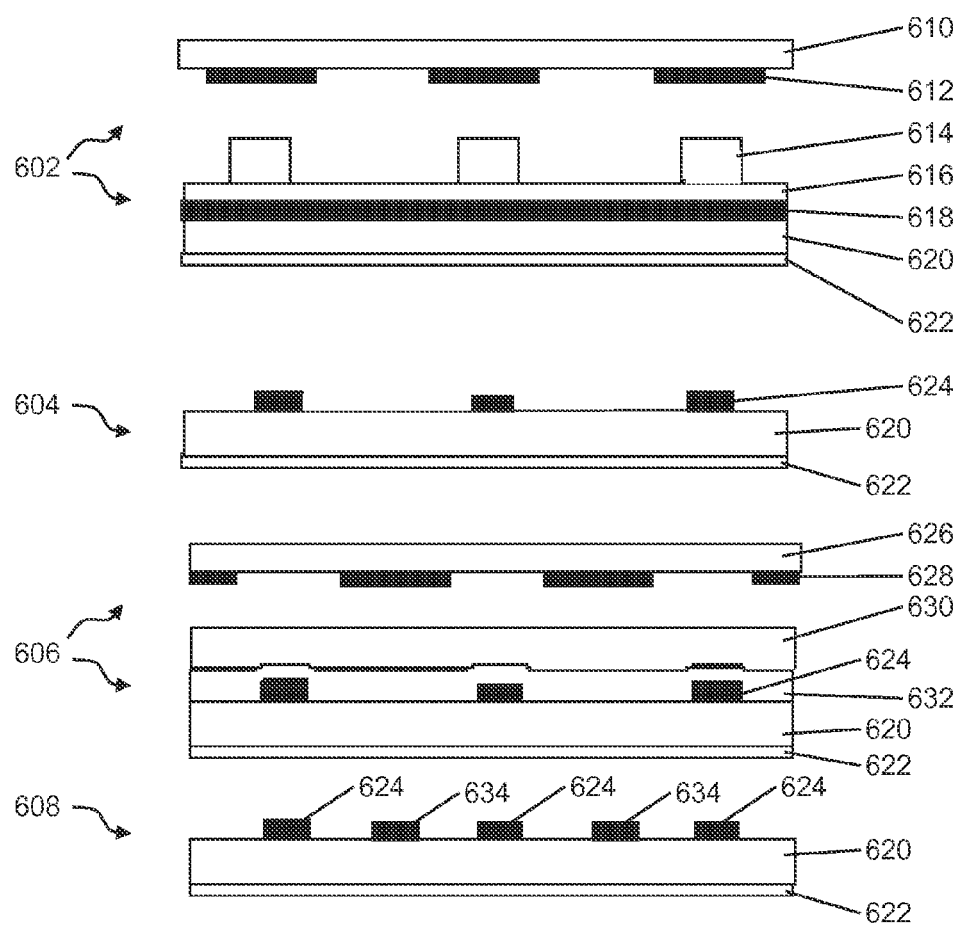
FIG. 6 illustrates a prior art Litho Etch Litho Etch (LELE) process for double patterning lithography of a grating structure.

FIG. 6 illustrates the prior art Litho Etch Litho Etch (LELE) process for double patterning lithography of a grating structure. This is a "positive" lithography LELE process that produces a hard mask grating. In the first exposure and development step 602 a reticle 610 having a pattern 612 is used to create a corresponding resist structure 614 on the Bottom Anti-Reflective Coating (BARC) layer 616. The underlying layers comprises a hard mask layer 618 on polysilicon 620 with an underlying layer of silicon dioxide 622. An etch step 604 transfers the pattern from the resist structure 614 into the hard mask layer 618 to produce a hard mask pattern 624. After a deposition coating steps (not shown), a second exposure step 606 uses a second reticle 626 having a pattern 628 to expose a coated resist layer 630 on deposited hard mask layer 632. After developing and etching, the result in step 608 is a structure with features 624 and 634 interleaved to provide a hard mask grating structure, which may then be used as an etch mask to transfer the pattern into the underlying layer.

As with LFLE, in LELE, it is desirable to have accurate overlay between the two exposure steps 602 and 606 in order to provide uniform spacing between features produced on the substrate shown in step 608.

Figure 7:
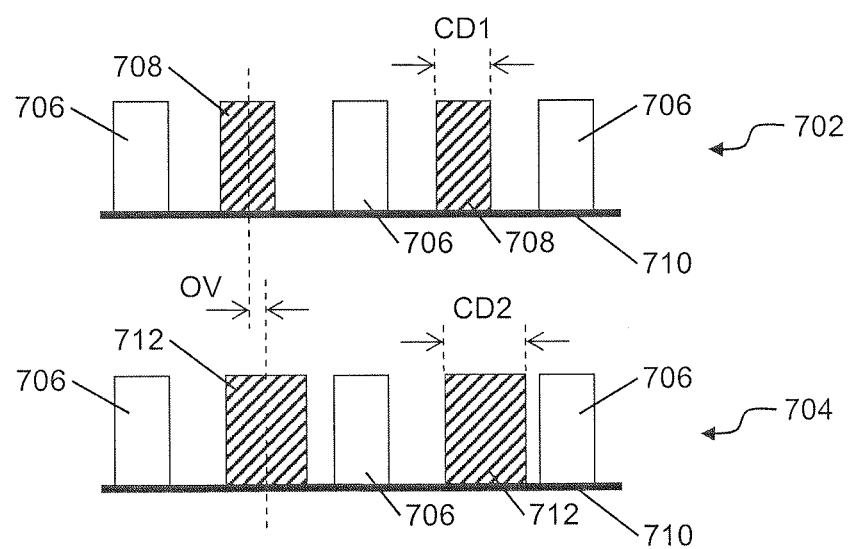
FIG. 7 illustrates the effect of an overlay offset on the CD of resist bars for the LFLE process.

When a reticle (e.g., 626) for the second exposure step (e.g., in steps 512, 606) contains multiple targets with predetermined imposed mask overlay bias in the second printed bar with respect to the first printed bar, the reconstructed CD behaves systematically with the imposed offset. FIG. 7 illustrates the effect of an overlay offset OV on the CD of resist bars for the LFLE process. In FIG. 7, two cross sections 702 and 704 are shown of grating targets produced by the LFLE process, for example as described with reference to FIG. 5.

The first cross section 702 shows a grating target made of resist bars 706 (corresponding to 514 in FIG. 5) with interleaved resist bars 708 (corresponding to 524 in FIG. 5). The substrate is represented by the line 710. In cross section 702 the overlay offset is zero and there is even spacing on either side of resist bars 708 with respect to resist bars 706. Furthermore, the exposure of the resist bars 708 at the second exposure and development step has been controlled to give a critical dimension CD1 that is equal to the critical dimension of the resist bars 706 created by the first exposure and development step.

The second cross section 704 illustrates the interdependence of overlay and critical dimension in the LFLE process. The second bars 712 are shifted to the right compared to cross section 702 by an overlay offset OV. It is observed that this causes the critical dimension of the second printed bars 712 to increase to CD2, which is larger compared to the dimension CD1 of bar 708 in cross section 702.

There are various mechanisms that may result in CD being dependent on overlay offset in such structures. For example, exposure of the resist (522 in FIG. 5) in proximity to the first bars 514 may be affected by scattering of exposure radiation by the structures 514 and 520 or by resist 522 thickness variation in close proximity to the first bars 514.

Although resist bars have been shown in these examples, these effects and the application of the present invention are not limited to 1-D gratings made of bars. 2-D gratings may be used. Other structures more closely resembling semiconductor device structures may also be used to mimic and allow closer control of the semiconductor device fabrication process. Overlay is usually a 2-D X-Y metric. Although this embodiment relates to overlay in one direction, the present invention may be applied the orthogonal direction in addition. If the target is 2-D periodic, then still a minimum three targets are needed to determine the overlay in by fitting in two orthogonal directions.

Figure 8:
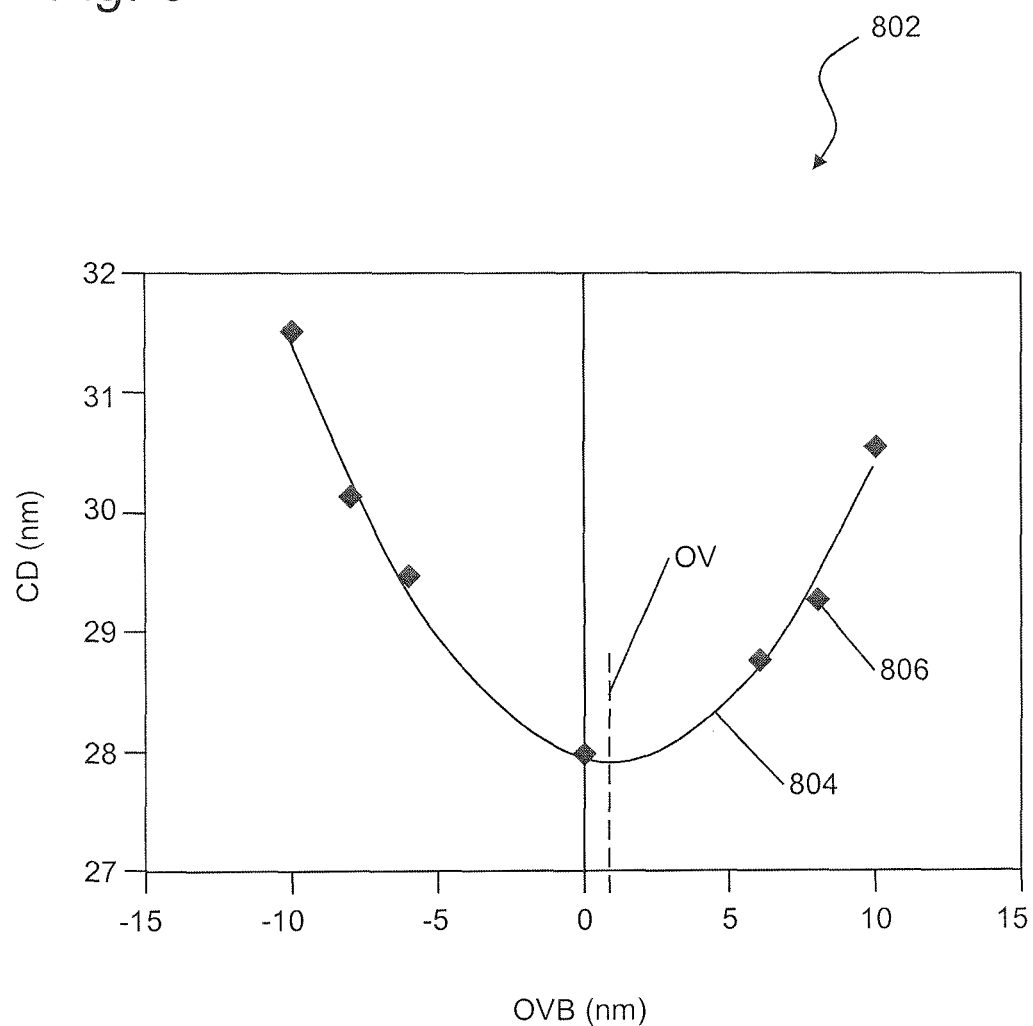
FIG. 8 illustrates a graph of reconstructed critical dimension CD against a deliberately applied mask overlay bias OVB between the two exposure steps in the LFLE process.

FIG. 8 illustrates a graph 802 of reconstructed critical dimension CD measured in nanometers (nm) against a deliberately applied mask overlay bias OVB (in nm) between the two exposure steps in the LFLE process. FIG. 8 shows results for nested CD targets each of nominal 32 nm linewidth. The first exposure step overlay bias is zero for all data points and the second exposure step overlay biases are −10, −8, −6, 0, +6, +8 and +10 nm respectively. Alternatively, the biases may be applied in the first exposure step, or a combination of the first or second exposure steps.

In this example, regression analysis is used to fit a parabola 804 to the measured data points 806. Although a parabola is used in this example, other functions could be used, so long as they allow the identification of a minimum CD value that corresponds to the overlay offset OV. Instead of fitting a function, the minimum CD value could be obtained directly from the measurements by finding the lowest measured CD and using its corresponding overlay bias value as the estimate of the overlay offset. However, function fitting requires fewer measurements to obtain more accurate results. In this example, fitting the parabola and determining the minimum yields the overlay. At minimum three targets are needed to determine the overlay by fitting; measuring more targets will give a better representation of the minimum. At larger printed overlay offset values it is found that the curve is a sine-like curve.

The CD of the interleaved at-resolution bars (708 and 712 in FIG. 7) may be determined using known reconstruction methods. In the reconstruction model fixed parameters are used for the profile for the first bars (features 706 in FIG. 7).

The reconstruction method may then yield a modeled value for the CD of the second bars at each overlay bias, i.e., data points 806. Thus, a scatterometry system can measure the relative line width of the second bar by fixing the first bar in the scatterometry system's reconstruction model. The overlay at which the modeled CD value is a minimum is then obtained as the estimator for the overlay. However, fixing the first bar profile to the nominal settings does not change the overlay measurement results. The only resulting difference from taking different starting parameters for profile of the first bar is the lifting of the constant in the equation of the fitted parabola. This means that the determined CD of the second bar does not have accurate representation of the line width itself, but it is still a good means to determine overlay.

In this example, the minimum of the parabola 804 determined by the regression is used as an estimator for the overlay. In this case a result of overlay of 0.89 nanometers is obtained. In experiments, the repeatability over ten runs has been found to be 0.2 nanometers.

The required mask bias is determined depending on the overlay values that are expected. In this example a range between +/−10 nm was used for overlay values in the same range. This makes this technique very suitable for small range overlay metrology.

Figure 9:
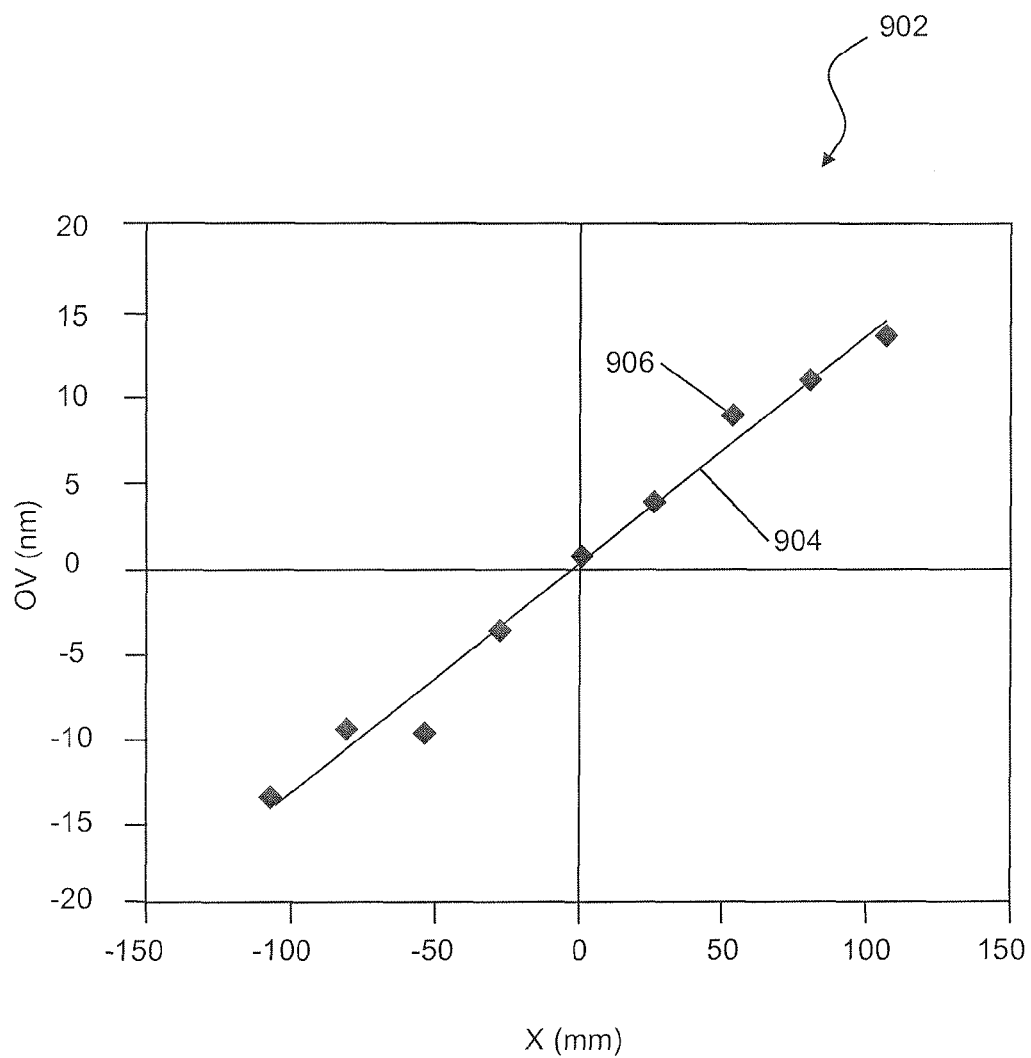
FIG. 9 illustrates the results of the application of an embodiment of the present invention with a graph of overlay (OV) against position across a wafer with an imposed wafer scaling offset.

FIG. 9 illustrates the results of the application of an embodiment of the present invention. The graph 902 shows overlay (OV) measured in nanometers against an X position (measured in millimeters) across a wafer with an imposed wafer scaling offset. Linear regression is used to fit the line 904 to the measured data points. Repeating the measurement ten times shows a repeatability of 0.2 nm.

Figure 10:
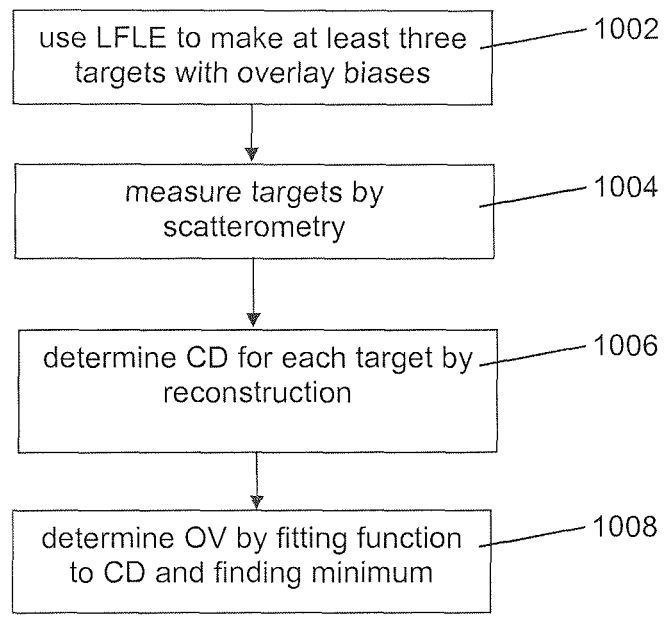
FIG. 10 illustrates steps of a method of measurement of lateral overlay offset according to an embodiment of the present invention.

FIG. 10 illustrates the steps of a method of measurement of lateral overlay offset according to an embodiment of the present invention.

Step 1002 is providing at least three targets, each target comprising a first marker (grating) and a second marker (interleaved grating) and each target having a different overlay bias between its first and second marker. The first and second markers are provided by subsequent lithography steps in a double patterning lithographic process such as LFLE or LELE.

Step 1004 is measuring the targets and step 1006 is determining for each target a measured CD of at least one of the markers using reconstruction. The CD of the first marker may be fixed in the reconstruction.

Step 1008 is using the measured CDs and at least one of the overlay biases to determine an overlay result corresponding to a minimum measured CD. The overlay result may be determined by fitting a function to the measured CDs and the overlay biases and determining the overlay at the minimum of the fitted function. Alternatively, the overlay result is determined by finding the smallest of the measured CDs and using its corresponding overlay bias to determine the overlay result.

In the manufacture of lithographic apparatus, the present invention is suitable for the qualification of scanners for LFLE double patterning, instead of using slow, costly and less accurate SEM measurements. LFLE is preferable for such qualification applications because there is no need for etch equipment in the factory. In production of semiconductor devices, LELE is more useful. In LELE, there is a coupling between overlay and CD, therefore the present invention is applicable to the LELE process. Furthermore, the present invention is applicable to any process where there is a coupling between overlay and CD and it is possible to determine a minimum CD.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

A stand-alone computer or the processing unit PU described above with reference to FIGS. 3 and 4 may be configured to perform the steps of determining CD for each target and determining an overlay offset result as described with reference to steps 1006 and 1008 in FIG. 10.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A method comprising:
    measuring first through third targets having first and second markers and different respective predetermined overlay bias between respective ones of the first and second markers;
    determining a measured dimension for each of the first through third targets; and
    using the measured dimensions and at least one of the predetermined overlay biases to determine an overlay offset result corresponding to a minimum dimension.

2. The method according to claim 1, wherein:
    the measuring comprises,
        projecting a radiation beam onto each of the first through third targets;
        detecting radiation having interacted with each of the first through third targets; and
    wherein the determining comprises using the detected radiation.

3. The method according to claim 1, wherein the measured dimension comprises a measured dimension of at least one of the first and second markers of the first through third targets.

4. The method according to claim 1, wherein the first and second markers are provided by subsequent lithography steps in a double patterning lithographic process.

5. The method according to claim 1, wherein the measured dimensions are determined using reconstruction.

6. The method according to claim 5, wherein a modeled dimension of one of the first and second markers corresponding to the measured dimension of another of the first and second markers is fixed in the reconstruction.

7. The method according to claim 1, wherein the overlay offset result is determined by fitting a function to the measured dimensions and the predetermined overlay biases and determining an overlay value at a minimum of the fitted function.

8. The method according to claim 1, wherein the overlay offset result is determined by determining a smallest of the measured dimensions and using its corresponding predetermined overlay bias to determine the overlay offset result.

9. An inspection apparatus for measuring an overlay offset on a substrate comprising three targets, each of the three targets comprising first and second markers and each of the three targets having a different respective predetermined overlay bias between respective ones of the first and second markers, the inspection apparatus comprising:
    a projection system configured to project a radiation beam onto each of the three targets;
    a detector configured to detect radiation having interacted with each of the three targets; and
    a processor configured to determine for each of the three targets a measured dimension using the detected radiation and to use the measured dimensions and at least one of the predetermined overlay biases to determine an overlay offset result co r responding to a minimum dimension.

10. The inspection apparatus according to claim 9, wherein the measured dimension comprises a measured dimension of at least one of the first and second markers of each of the three targets.

11. The inspection apparatus according to claim 9, wherein the first and second markers are provided by subsequent lithography steps in a double patterning lithographic process.

12. The inspection apparatus according to claim 9, wherein the processor is configured to determine the measured dimensions using reconstruction.

13. The inspection apparatus according to claim 12, wherein the processor is configured to fix in the construction a modeled dimension of one of the first and second markers corresponding to the measured dimension of another one of the first and second markers.

14. The inspection apparatus according to claim 9, wherein the processor is configured to determine the overlay offset result by fitting a function to the measured dimensions and the predetermined overlay biases and to determine an overlay value at a minimum of the fitted function.

15. The inspection apparatus according to claim 9, wherein the processor is configured to determine a smallest of the measured dimensions and use its corresponding predetermined overlay bias to determine the overlay offset result.

16. A lithographic apparatus comprising:
    a support configured to support a patterning device configured to pattern a beam;
    a projection system configured to project the patterned beam onto a substrate; and
    an inspection apparatus for measuring an overlay offset on a substrate comprising three targets, each of the three targets comprising first and second markers and each of the three targets having a different respective predetermined overlay bias between respective ones of the first and second markers, the inspection apparatus comprising:
        another projection system configured to project a radiation beam onto each of the three targets;
        a detector configured to detect radiation having interacted with each of the three targets; and
        a processor configured to determine for each of the three targets a measured dimension using the detected radiation and to use the measured dimensions and at least one of the predetermined overlay biases to determine an overlay offset result corresponding to a minimum dimension.

17. An article of manufacture including a computer-readable non-transitory medium having instructions stored thereon, executed of which by a computing device cause the computing device to perform operations comprising:
- measuring first through third targets having first and second markers and different respective predetermined overlay bias between respective ones of the first and second markers;
- determining a measured dimension for each of the first through third targets; and
- using the measured dimensions and at least one of the predetermined overlay biases to determine an overlay offset result corresponding to a minimum dimension.

18. A computer-readable non-transitory medium having instructions stored thereon, the instructions comprising:
- instructions for measuring first through third targets having first and second markers and different respective predetermined overlay bias between respective ones of the first and second markers;
- instructions for determining a measured dimension for each of the first through third targets; and
- instructions for using the measured dimensions and at least one of the predetermined overlay biases to determine an overlay offset result corresponding to a minimum dimension.

* * * * *

UNITED STATES PATENT AND TRADEMARK OFFICE
CERTIFICATE OF CORRECTION

| | | |
|---|---|---|
| PATENT NO. | : 8,982,328 B2 | Page 1 of 1 |
| APPLICATION NO. | : 12/906960 | |
| DATED | : March 17, 2015 | |
| INVENTOR(S) | : Megens et al. | |

It is certified that error appears in the above-identified patent and that said Letters Patent is hereby corrected as shown below:

Claims

In Col 14, line 14, claim 9, please delete "co r responding" and insert --corresponding--.

Signed and Sealed this
Third Day of November, 2015

Michelle K. Lee
*Director of the United States Patent and Trademark Office*